United States Patent [19]

Aramaki

[11] 4,410,928
[45] Oct. 18, 1983

[54] CONNECTOR FIXING DEVICE

[75] Inventor: Mitsuo Aramaki, Toda, Japan

[73] Assignee: Clarion Co., Ltd., Tokyo, Japan

[21] Appl. No.: 259,730

[22] Filed: May 1, 1981

[30] Foreign Application Priority Data

May 7, 1980 [JP]  Japan .............................. 55-61479[U]

[51] Int. Cl.³ .............................................. H05K 1/18
[52] U.S. Cl. .................................... 361/400; 361/426;
174/138 G; 339/17 C
[58] Field of Search .............. 339/17 C, 17 CF, 17 F,
339/17 L, 17 LC, 119 R, 125 R, 65, 66, 112 R;
174/138 G, 52 FP; 361/400, 403, 426, 398, 427,
417–419

[56] References Cited

U.S. PATENT DOCUMENTS

| 3,388,210 | 6/1968 | Babb | 339/66 T |
| 3,414,869 | 12/1968 | Pascua | 339/66 T |
| 3,612,749 | 10/1971 | Grube, Jr. | 174/138 G |
| 4,143,931 | 3/1979 | Skare | 339/17 F |

FOREIGN PATENT DOCUMENTS

| 2257888 | 5/1974 | Fed. Rep. of Germany | 174/138 G |
| 877020 | 9/1961 | United Kingdom | 174/138 G |

Primary Examiner—G. P. Tolin
Attorney, Agent, or Firm—Flynn, Thiel, Boutell & Tanis

[57] ABSTRACT

A connector fixing device having a mounting mold disposed between a connector and a board in which the connector can be fixed by fixing the mounting mold on a relative element.

7 Claims, 4 Drawing Figures

CONNECTOR FIXING DEVICE

BACKGROUND OF THE INVENTION

1. Field of the Invention

This invention relates to an improvement of a connector fixing device. In a conventional means for fixing a connector, as shown in FIG. 1, a connector 1 is soldered at its portion 3 to a printed board 2. The printed board 2 is fixed to a mounting plate 5 by means of screws 4. Alternatively as shown in FIG. 2, a connector 1 is mounted on a flexible plate 6 which is adhered with a lining plate 7. The flexible plate 6 is fixed to a mounting plate 8 by twisting the claw 9 formed on the mounting plate 8 after inserting it through the through bore 10 formed in a flexible plate 6.

However, such conventional fixing methods have drawbacks in that it is difficult to mount a connector to the printed circuit board when there is a narrow working space therearound, and that, due to the direct connection of the connector to printed board, patterns formed on the printed board are apt to peel off when the male connector is coupled to or removed from the connector 1.

SUMMARY OF THE INVENTION

In accordance with the present invention, in order to overcome such conventional drawbacks as mentioned above, there is provided a connector fixing device comprising a connector element having a plurality of terminals; a board; a mounting plate disposed between said connector element and said board; said mounting plate having a plurality of slits for receiving said terminals therein.

DESCRIPTION OF PREFERRED EMBODIMENTS

Figure 1:
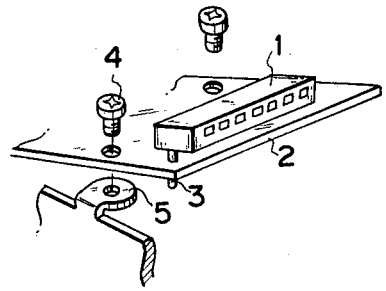
FIG. 1 and FIG. 2 each show a conventional means for fixing a connector.
Figure 2:
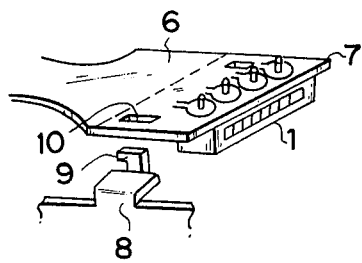
Figure 3:
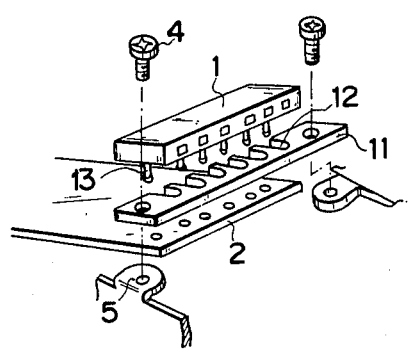
FIG. 3 shows an embodiment according to the present invention.

The present invention is hereunder described in detail, referring to the drawings. In FIG. 3 the reference numeral 11 designates a mounting plate which is disposed between a connector 1 and a printed board 2. The plate 11 has a plurality of slits 12 for receiving connector terminals 13 therein, each terminal being soldered to the printed board 2. In this case, mounting operation can be easily carried out by soldering the connector terminals to the board after previously fixing the connector 1 and the mounting plate 11 on the board by means of adhesive tape.

Then, the mounting plate 11 is rigidly fixed to a mounting plate 5 by means of screws 4.

Figure 4:
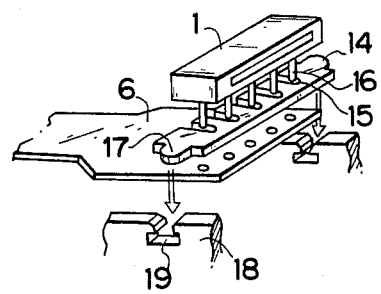
FIG. 4 shows another embodiment according to the present invention.

FIG. 4 shows another embodiment according to the present invention in which a mounting plate 14 is interposed between the connector 1 and a flexible plate 6. Connector terminals 16 received in slits 15 are soldered to the plate 6 in the same manner as in the embodiment shown in FIG. 3. Claws 17 integrally formed with the mounting plate 11 each is inserted in a corresponding one of the slits 19 which are formed in a mounting base 18.

As described above, according to the present invention, there is provided a mounting plate which can be formed with an engaging portion of any configuration, to thereby make easier the mounting operation in a narrow space. Further, if the connector and the mounting plate are previously fixed with each other, the plates cover the soldered portions of the connector terminals, thus to prevent the patterns on the board from peeling off upon insertion of the connector.

I claim:

1. A connector and a fixing device therefor, comprising:

an electrical connector having a plurality of terminals projecting therefrom;

a printed circuit board having a plurality of apertures for receiving said terminals;

a mounting plate disposed between said connector and said board, said mounting plate being fixed to said board, said mounting plate having a plurality of through slits each aligned with one of said apertures, each of said slits receiving one of said terminals therethrough so that each of said terminals extends into one of said apertures, said terminals being electrically connected to said board, said mounting plate having end portions projecting laterally beyond the lateral edges of said printed circuit board, said end portions having attaching means thereon; and a base attachable to said end portions of said mounting plate for supporting said mounting plate and thereby supporting said printed circuit board and said connector.

2. A connector and fixing device as claimed in claim 1 in which said base is formed with bores;

said attaching means comprising claws formed on said end portions of said mounting plate;

each of said claws being received in one of said bores.

3. A connector and fixing device as claimed in claim 1 wherein said mounting plate is fixed on said board by means of adhesive tape.

4. A connector and a mounting structure therefor, comprising:

an elongated electrical connector, said connector having a base wall having a plurality of parallel terminals projecting therefrom, said connector also having a front wall having a plurality of sockets therein;

a printed circuit board having an upper surface disposed parallel with the base wall of said connector and having a plurality of holes therethrough each aligned with one of said terminals;

an elongated mounting plate disposed between said base wall of said connector and said upper surface of said printed circuit board, said mounting plate being fixed to the upper surface of said printed circuit board, said mounting plate having a plurality of parallel slits therethrough each aligned with one of said terminals and one of said holes, each of said terminals extending through one of said slits and into the hole that is aligned therewith, said terminals being soldered to said board, said mounting plate having end portions projecting laterally beyond the lateral edges of said printed circuit board, said end portions having attaching means thereon; and a base attachable to said end portions of said mounting plate for supporting said mounting plate and thereby supporting said printed circuit board and said connector.

5. A connector and a mounting structure therefor, comprising:

an elongated connector in the form of a thin strip having a planar base wall, a planar upper wall parallel with said base wall, upright front and rear walls extending between said base and upper walls, and upright end walls extending between said base and upper walls at the ends of said connector, said connector having a plurality of parallel terminals projecting from said base wall and arranged in a straight row extending lengthwise of said connector, said front wall having a plurality of sockets therein;

a printed circuit board having an upper surface disposed parallel with the base wall of said connector and having a plurality of holes therethrough adjacent to one end thereof, said holes being arranged in a straight row and each hole being aligned with one of said terminals;

an elongated mounting plate in the form of a thin strip having parallel upper and lower surfaces, front and rear edges and end portions at the opposite longitudinal ends thereof, said mounting plate being sandwiched between and having its upper and lower surfaces in contact with said base wall of said connector and said upper surface of said printed circuit board, respectively, said mounting plate being adhesively fixed to the upper surface of said printed circuit board, said mounting plate having a plurality of parallel slits therethrough and opening through one of said edges of mounting plate, each slit being aligned with one of said terminals and one of said holes, each of said terminals extending through one of said slits and into the hole that is aligned therewith, said terminals being soldered to said board, the end portions of said mounting plate projecting laterally beyond the lateral edges of said printed circuit board, said end portions having attaching means thereon; and a base attachable to said end portions of said mounting plate for supporting said mounting plate and thereby supporting said printed circuit board and said connector.

6. A connector and a mounting structure therefor, as claimed in claim 5 in which said attaching means comprises holes through said end portions of said mounting plate and screws extending through said holes and securing said end portions to said base.

7. A connector and a mounting structure therefor, as claimed in claim 5 in which said attaching means comprises claws on said mounting plate which extend into slots in said base.

* * * * *